United States Patent
Chen et al.

(10) Patent No.: US 8,945,959 B2
(45) Date of Patent: Feb. 3, 2015

(54) LED WITH THIN PACKAGE STRUTURE AND METHOD FOR MANUFACTURING THE SAME

(71) Applicant: Advanced Optoelectronic Technology, Inc., Hsinchu Hsien (TW)

(72) Inventors: Pin-Chuan Chen, Hsinchu (TW); Chao-Hsiung Chang, Hsinchu (TW); Hsin-Chiang Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/919,721

(22) Filed: Jun. 17, 2013

(65) Prior Publication Data

US 2014/0008681 A1    Jan. 9, 2014

(30) Foreign Application Priority Data

Jul. 6, 2012 (CN) .......................... 2012 1 02330238

(51) Int. Cl.
| | |
|---|---|
| H01L 21/00 | (2006.01) |
| H01L 33/60 | (2010.01) |
| H01L 33/52 | (2010.01) |
| H01L 33/48 | (2010.01) |
| H01L 33/62 | (2010.01) |
| H01L 33/54 | (2010.01) |

(52) U.S. Cl.
CPC ................ *H01L 33/60* (2013.01); *H01L 33/52* (2013.01); *H01L 33/486* (2013.01); *H01L 33/62* (2013.01); *H01L 33/54* (2013.01); *H01L 2933/0033* (2013.01); *H01L 2933/0066* (2013.01); *H01L 2224/48091* (2013.01); *H01L 2224/8592* (2013.01)

USPC ............. 438/26; 438/116; 438/121; 438/123; 438/124

(58) Field of Classification Search
CPC ........... H01L 2224/32245; H01L 2924/15153; H01L 2924/1517
USPC ............................ 438/26, 116, 121, 123, 124
See application file for complete search history.

(56) References Cited

U.S. PATENT DOCUMENTS

| | | | |
|---|---|---|---|
| 7,247,938 B2 * | 7/2007 | Groenhuis et al. ............. | 257/699 |
| 2011/0042794 A1 * | 2/2011 | Hsieh et al. .................. | 257/676 |
| 2012/0313131 A1 | 12/2012 | Oda et al. | |
| 2013/0161670 A1 * | 6/2013 | Peng ............................... | 257/98 |

FOREIGN PATENT DOCUMENTS

| | | |
|---|---|---|
| TW | M405052 U1 | 6/2011 |
| TW | 201214778 A1 | 4/2012 |
| TW | 201220524 A1 | 5/2012 |

\* cited by examiner

*Primary Examiner* — Matthew E Warren

(74) *Attorney, Agent, or Firm* — Novak Druce Connolly Bove + Quigg LLP

(57) ABSTRACT

A method for manufacturing an LED (light emitting diode) is disclosed wherein a metal substrate is provided. A chip fastening area with a depression and two wire fixing areas on the first metal substrate are defined on the metal substrate. The chip fastening area and the wire fixing areas are separated by a plurality of first grooves. An LED chip is provided in the depression of the chip fastening area and electrically connected to the wire fixing areas by wires. An encapsulant is formed to cover and connect the chip fastening area and the wire fixing areas. Portions of the metal substrate except the chip fastening area and the wire fixing areas are removed.

11 Claims, 9 Drawing Sheets

LED WITH THIN PACKAGE STRUTURE AND METHOD FOR MANUFACTURING THE SAME

BACKGROUND

1. Technical Field

The present disclosure relates to LEDs (light emitting diodes) and methods for manufacturing the LEDs, and more particularly, to an LED with thin package structure and a method for manufacturing the same.

2. Description of Related Art

LEDs (Light-Emitting Diodes) have many advantages, such as high luminosity, low operational voltage, low power consumption, compatibility with integrated circuits, easy driving, long term reliability, and environmental friendliness. Such advantages have promoted the wide use of the LEDs as a light source. Generally, the LEDs are thick in that substrates are needed in LEDs for supporting LED chips, reflecting cups and electrodes. As a result of that, lighting devices using LEDs as lighting sources can not be made with thin and small profiles. Thus, typical LEDs can not adapt to development trend of thin products.

What is needed, therefore, is an LED with thin package structure and a method for manufacturing the same which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Referring to FIGS. 1-7, a method for manufacturing an LED 100 in accordance with a first embodiment of the present disclosure is shown. The method mainly includes several steps as shown below.

Figure 1:
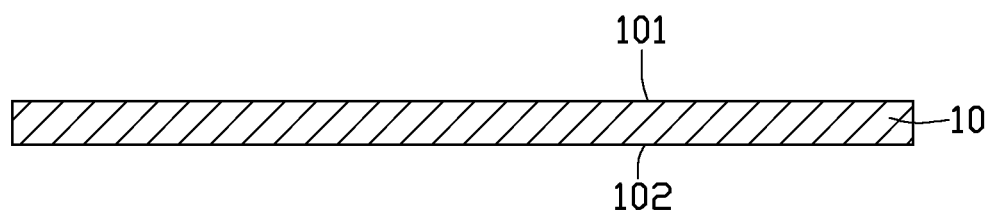
FIG. 1 shows a first step of a method for manufacturing an LED in accordance with a first embodiment of the present disclosure.

Firstly, a first metal layer 10 is provided as shown in FIG. 1. The first metal layer 10 is a thin plate layer which can be a copper foil. The first metal layer 10 includes a first surface 101 which is on a top of the first metal layer 10, and a second surface 102 which is on a bottom of the first metal layer 10 and is opposite to the first surface 101. The first surface 101 and the second surface 102 are parallel to each other.

Figure 2:
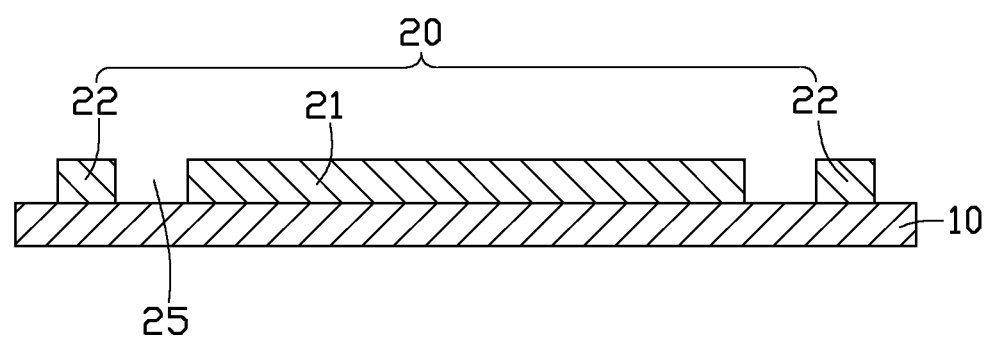
FIG. 2 shows a second step of the method for manufacturing the LED in accordance with the first embodiment of the present disclosure.

As shown in FIG. 2, a second metal layer 20 is attached to the first metal layer 10. In this embodiment, the second metal layer 20 is mounted on the first surface 101 of the first metal layer 10. The second metal layer 20 is made of materials as same as the first metal layer 10, such as copper. The second metal layer 20 includes a chip fastening area 21 which is defined on a middle of the first surface 101 of the first metal layer 10 and a wire fixing area 22 which is defined on a periphery of the first surface 101 of the first metal layer 10. The chip fastening area 21 and the wire fixing area 22 are electrically insulated from each other by separating gaps 25 defined therebetween. In this embodiment, the second metal layer 20 includes two separated wire fixing area 22 which are defined at two opposite side of the periphery of the first surface 101. The first surface 101 of the first metal layer 10 is partially exposed through the gaps 25 between the chip fastening area 21 and the wire fixing area 22.

Figure 3:
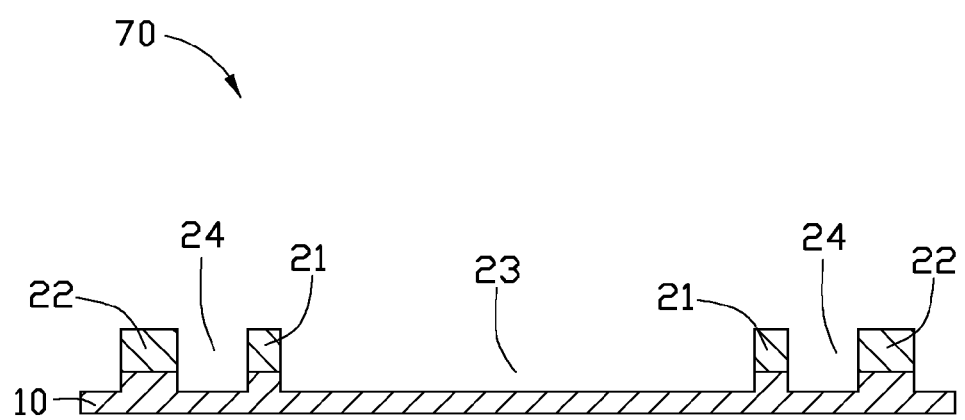
FIG. 3 shows a third step of the method for manufacturing the LED in accordance with the first embodiment of the present disclosure.

As shown in FIG. 3, a metal substrate 70 is manufactured by partly etching the first metal layer 10 and the second metal layer 20. Portions of the first metal layer 10 which are corresponding to the gaps 25 between the chip fastening area 21 and the wire fixing areas 22 of the second metal layer 20 are etched to a certain depth but not through the first metal layer 10 to define a plurality of first grooves 24 between the chip fastening area 21 and the wire fixing areas 22 of the second metal layer 20. A middle portion of the chip fastening area 21 of the second metal layer 20 and a portion of the first metal layer 10 which are corresponding to the middle portion of the chip fastening area 21 are etched to define a depression 23. The depression 23 has a depth equal to a depth of the first grooves 24. In this embodiment, the first metal layer 10 and the second metal layer 20 are etched by dry etching process. In this embodiment, an edge portion of the first metal layer 10 is also etched to form a flange outside the wire fixing areas 22.

Figure 4:
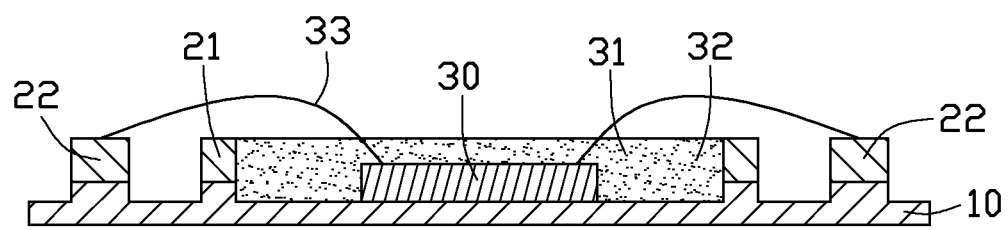
FIG. 4 shows a fourth step of the method for manufacturing the LED in accordance with the first embodiment of the present disclosure.

As shown in FIG. 4, an LED chip 30 is set inside the depression 23 and electrically connected to the wire fixing areas 22 by wires 33. A height of the LED chip 20 is less than the depth of the depression 23. A fluorescent layer 31 is formed to cover the LED chip 30. It is preferred that, the fluorescent layer 31 contains phosphor 32 and fully fills the depression 23. Since the depression 23 is surrounded by the first metal layer 10 and the second metal layer 20, light emitted from the LED chip 30 can be reflected efficiently then emit outwards.

Figure 5:
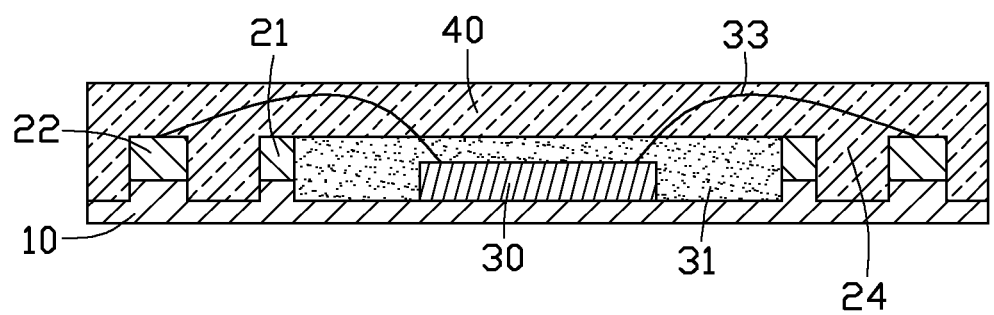
FIG. 5 shows a fifth step of the method for manufacturing the LED in accordance with the first embodiment of the present disclosure.

As shown in FIG. 5, an encapsulant 40 is formed to cover the second metal layer 20, the first metal layer 10 and the fluorescent layer 31. The encapsulant 40 fully fills the first grooves 24 and covers the wires 33. The encapsulant 40 is made of transparent materials and formed by injection molding process. It is understood that the fluorescent layer 31 can be a part of the encapsulant 40 which is formed together with the encapsulant 40. In this embodiment, the encapsulant 40 also fills to the flange of the first metal layer 10.

Figure 6:
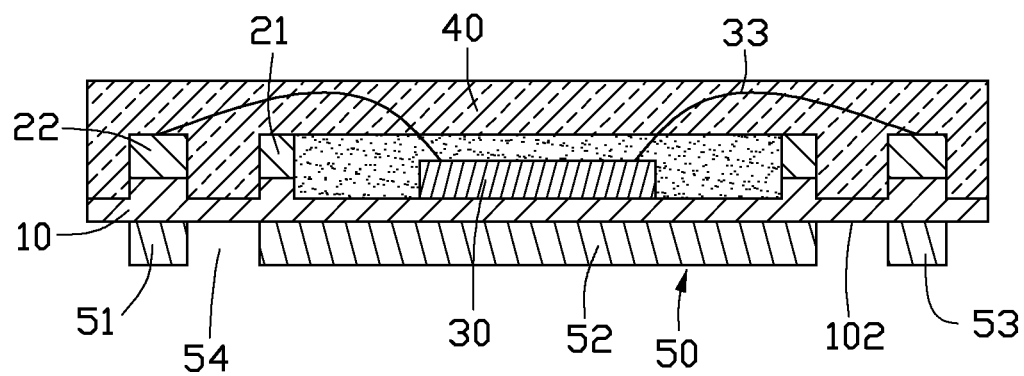
FIG. 6 shows a sixth step of the method for manufacturing the LED in accordance with the first embodiment of the present disclosure.

As shown in FIG. 6, a third metal layer 50 is defined below the second surface 102 of the second metal layer 20. The third metal layer 30 is made of materials as same as the first metal layer 10 and the second metal layer 20 such as copper. The third metal layer 50 includes a first portion 51, a second portion 52 and a third portion 53. The three portions 52, 51, 53 are respectively corresponding to the chip fastening area 21 and the wire fixing areas 22, Second grooves 54 which are corresponding to the first grooves 24 are defined between the three portions 51, 52, 53. Portions of the second surface 102 of the first metal layer 10 are exposed through the second grooves 54. A thickness of the third metal layer 50 is bigger than a left thickness of the first metal layer 10 corresponding to the first grooves 24. In this step, the portions of the first metal layer 10 which are corresponding to the wire fixing areas 22 have the original thickness, and other portions of the first metal layer 10 have the left thickness.

Figure 7:
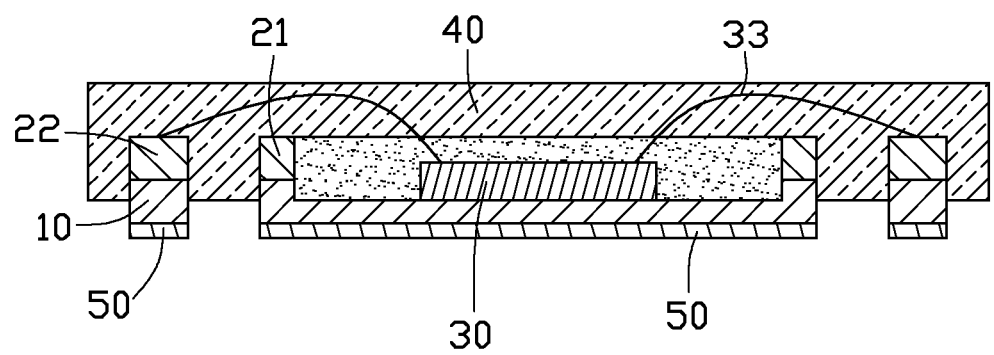
FIG. 7 shows a seventh step of the method for manufacturing the LED in accordance with the first embodiment of the present disclosure.

As shown in FIG. 7, the first metal layer 10 and the third metal layer 50 is etched from bottom towards top until the portions of first metal layer 10 corresponding to the first grooves 24 is totally removed. That is, the portions of first metal layer 10 corresponding to the first grooves 24 are removed, thereby the encapsulant 40 is exposed towards the second grooves 54, and the third metal layer 50 becomes thinner, the chip fastening area 21 is connected with the two wire fixing areas 22 only by the encapsulant 40. It is preferred that wet etching process is used in this step. In this step, portions of the first metal layer 10 corresponding to the chip fastening area 21 and the wire fixing areas 22 are left and the flange of the first metal layer 10 is etched away. Because of fast rate and isotropic property of wet etching process, an etched thickness of the third metal layer 50 which corresponding to the fastening area 21 and the wire fixing areas 22 is equal to an etched thickness of the first metal layer 10 which corresponding to the first grooves 24 and the second grooves 54. Alternatively, the thickness of the third metal layer 50 is equal to the left thickness of the first metal layer 10 corresponding to the first grooves 24, so that the third metal layer 50 is totally removed when the portions of first metal layer 10 corresponding to the first grooves 24 is totally removed.

It is understood that the third metal layer 50 can be omitted as long as the portions of the first metal layer 10 corresponding to the first grooves 24 is totally etched away by dry etching process to partly expose the encapsulant 40. Also, remnants of the third metal layer 50 can be removed in a following step.

Figure 8:
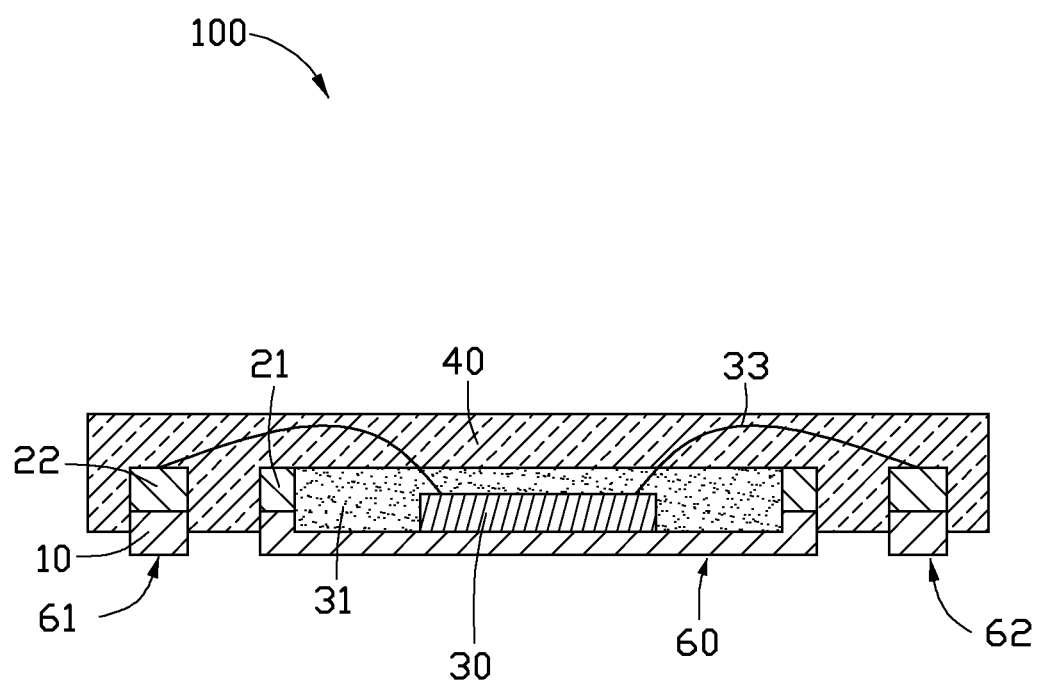
FIG. 8 shows a finished product of an LED made by the method in accordance with the first embodiment of the present disclosure.

As shown in FIG. 8, the LED 100 is made by the method in accordance with above steps in which the third metal layer 50 is totally removed. The LED 100 includes reflecting cup 60, a first electrode 61 and a second electrode 62 set beside the reflecting cup 60 respectively, the LED chip 30 set in the reflecting cup 60 and electrically connected to the first electrode 61 and the second electrode 62 by the wires 33. The LED 100 also includes the encapsulant 40 covering the reflecting cup 60, the first electrode 61 and the second electrode 62. The encapsulant 40 is also configured to be functioning as a connector between the reflecting cup 60, the first electrode 61 and the second electrode 62. The encapsulant 40 further includes the fluorescent layer 31 fully filling the reflecting cup 60. Accordingly, the reflecting cup 60 is made by the first metal layer 10, the second metal layer 20 in which the reflecting cup 60 can achieve good heat dissipating property. The first electrode 61 and the second electrode 62 are also made by the first metal layer 10, the second metal layer 20. Alternatively, when the third metal layer 50 is not totally removed, left portions of the third metal layer 50 function as parts of the reflecting cup 60, first electrode 61 and the second electrode 62. Thus, the LED 100 achieves separated set of heat and electricity. In this embodiment, the third metal layer 50 is removed, so that the reflecting cup 60 is made by the first metal layer 10 and the chip fastening area 21 of the second metal layer 20, the first electrode 61 and the second electrode 60 are made of the first metal layer 10 and the wire fixing areas 22 of the second metal layer 20.

Because the LED 100 is manufactured without any substrate, and the reflecting cup 60, the first electrode 61 and the second electrode 62 can be formed without support of substrates, a thickness of the LED 100 reduced. As a result, the LED 100 can be suitable in thin products. At the same time, the LED 100 is materials and processes saved without the substrate.

Figure 9:
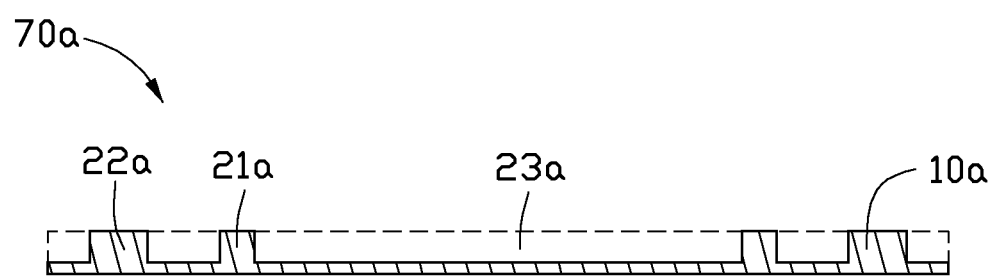
FIG. 9 is similar to FIG. 3, showing a step of providing a substrate of the LED in accordance with a second embodiment of the present disclosure.

Referring to FIG. 9, a step of providing a metal substrate 70a of the LED 100 in accordance with a second embodiment of the present disclosure is shown. Similar to the first step in the first embodiment, a first metal layer 10a with a certain thickness is provided. Then the first metal layer 10a is etched by dry etching process to form a chip fastening area 21a with a depression 23a and two wire fixing areas 22a separated from the chip fastening area 21a. Steps following are same as steps 4-7 in the first embodiment. Because the metal substrate 70a is formed by only the first metal layer 10a, a thickness can be smaller than the metal substrate 70 in the first embodiment.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A method for manufacturing an LED (light emitting diode), comprising:
   providing a metal substrate;
   etching the metal substrate to form a chip fastening area with a depression in the metal substrate, and two wire fixing areas on the metal substrate, a plurality of first grooves being defined between the chip fastening area and the wire fixing areas;
   providing an LED chip in the depression of the chip fastening area and electrically connected to the two wire fixing areas by wires;
   forming an encapsulant covering chip fastening area and the wire fixing areas and filling in the first grooves; and
   removing the metal substrate except portions which are formed as the chip fastening area and the wire fixing areas;
   wherein the metal substrate comprises a first metal layer and a second metal layer which are made of a same material;
   wherein the chip fastening area and the wire fixing areas are defined in the second metal layer, and gaps are defined between the chip fastening area and the wire fixing areas in the second metal layer; and
   wherein a middle portion of the chip fastening area of the second metal layer and a portion of the first metal layer which is corresponding to the middle portion of the chip fastening area are etched to define the depression for receiving the LED chip.

2. The method of claim 1, wherein the first metal layer comprises a first surface and a second surface opposite to the first surface, and the second metal layer is located on the first surface of the first metal layer.

3. The method of claim 1, wherein the first grooves are formed by partly etching the first metal layer exposed through the gaps.

4. The method of claim 1, wherein after the step of forming the encapsulant, a third metal layer is formed below the second surface of the first metal layer, and the third metal layer is made of materials as same as the first metal layer and the second metal layer.

5. The method of claim 4, wherein the third metal layer includes three portions correspond to the chip fastening area and the two wire fixing areas, and a plurality of second grooves which are corresponding to the first grooves are defined between the three portions.

6. The method of claim 5, wherein a thickness of the third metal layer is larger than or equal to an original thickness of the first metal layer.

7. The method of claim 6, wherein during the step of removing the metal substrate except portions which are formed as the chip fastening area and the wire fixing areas, the third metal layer is etched until portions of first metal layer corresponding to the first grooves is totally removed.

8. The method of claim 1, wherein the depression has a depth equal to a depth of the first grooves.

9. The method of claim 1, wherein the encapsulant further comprises a fluorescent layer fully filling the depression.

10. The method of claim 9, wherein the fluorescent layer contains phosphor doped therein.

11. The method of claim 1, wherein the chip fastening area is connected with the two wire fixing areas only by the encapsulant after the step of removing the metal substrate except portions which are formed as the chip fastening area and the wire fixing areas.

* * * * *